(12) United States Patent
Ozawa et al.

(10) Patent No.: US 6,921,063 B2
(45) Date of Patent: Jul. 26, 2005

(54) GAS DISSOLVED WATER PRODUCING APPARATUS AND METHOD THEREOF AND ULTRASONIC CLEANING EQUIPMENT AND METHOD THEREOF

(75) Inventors: Suguru Ozawa, Kanagawa (JP); Ryoichi Shinjo, Kanagawa (JP); Minoru Harada, Kanagawa (JP); Takayuki Saito, Kanagawa (JP); Kenichi Sasaki, Kanagawa (JP); Keiichi Murakawa, Tokyo (JP); Kazuhide Shimamura, Kanagawa (JP)

(73) Assignee: Ebara Corporation, Tokyo (JP)

( * ) Notice: Subject to any disclaimer, the term of this patent is extended or adjusted under 35 U.S.C. 154(b) by 111 days.

(21) Appl. No.: 10/311,832

(22) PCT Filed: Apr. 17, 2002

(86) PCT No.: PCT/JP02/03819

§ 371 (c)(1), (2), (4) Date: Dec. 19, 2002

(87) PCT Pub. No.: WO02/085790

PCT Pub. Date: Oct. 31, 2002

(65) Prior Publication Data

US 2004/0012104 A1 Jan. 22, 2004

(30) Foreign Application Priority Data

Apr. 19, 2001 (JP) ........................................ 2001-120828

(51) Int. Cl.⁷ ............................... B01F 3/04; B08B 6/00

(52) U.S. Cl. ..................... 261/23.1; 261/64.1; 261/67; 261/104; 134/1.3

(58) Field of Search ................... 261/23.1, 26, 49, 261/64.1, 67, 100, 104; 96/8, 10; 134/1, 1.3, 2, 902

(56) References Cited

U.S. PATENT DOCUMENTS

| | | | | |
|---|---|---|---|---|
| 5,985,811 A | * | 11/1999 | Masayuki et al. | 510/175 |
| 6,158,721 A | * | 12/2000 | Katou et al. | 261/26 |
| 6,210,748 B1 | * | 4/2001 | Nagahara et al. | 427/108 |
| 6,423,146 B1 | * | 7/2002 | Fukazawa | 134/2 |
| 6,444,255 B2 | * | 9/2002 | Nagahara et al. | 427/108 |
| 6,681,781 B2 | * | 1/2004 | Puri et al. | 134/1.3 |
| 6,715,944 B2 | * | 4/2004 | Oya et al. | 396/626 |
| 2001/0001392 A1 | * | 5/2001 | Hirae et al. | 134/1.3 |
| 2001/0009155 A1 | * | 7/2001 | Matsuno et al. | 134/2 |
| 2004/0079386 A1 | * | 4/2004 | Nagamura et al. | 134/1 |

FOREIGN PATENT DOCUMENTS

| | | |
|---|---|---|
| EP | 0 328 444 | 8/1989 |
| EP | 1 001 208 | 5/2000 |
| EP | 1 066 887 | 10/2001 |
| FR | 2 656 546 | 7/1991 |

OTHER PUBLICATIONS

Patent Abstracts of Japan, vol. 018, No. 643 (E–1640), Dec. 7, 1994 & JP 06 252313 A (EBARA Corp), Sep. 9, 1994.
Patent Abstracts of Japan, vol. 013, No. 044 (E–710), Jan. 31, 1989 & JP 63 239820 A (Hitachi Ltd), Oct. 5, 1988.

* cited by examiner

*Primary Examiner*—Scott Bushey
(74) *Attorney, Agent, or Firm*—Wenderoth, Lind & Ponack L.L.P.

(57) ABSTRACT

A gas dissolved water producing apparatus includes a gas dissolving section, a gas channel for guiding a gas into the dissolving section, a first water channel for guiding water into the dissolving section, a gas dissolved water discharge channel, and a second water channel for guiding the water without passing through the dissolving section. The second water channel joins the gas dissolved water discharge channel to control the solution gas dissolved in the gas dissolved water can be controlled to a prescribed level of concentration.

14 Claims, 10 Drawing Sheets

PRIOR ART

Fig. 10

GAS DISSOLVED WATER PRODUCING APPARATUS AND METHOD THEREOF AND ULTRASONIC CLEANING EQUIPMENT AND METHOD THEREOF

TECHNICAL FIELD

The present invention relates to an aqueous solution producing apparatus, in which the aqueous solution contains a gas dissolved therein, (hereafter referred to as gas dissolved water producing apparatus) and a method thereof. In particular, the invention relates to a gas dissolved water producing apparatus and a method of producing a gas dissolved water used in precision machineries, electronic industries and medical and food industries.

BACKGROUND OF ART

Figure 10:
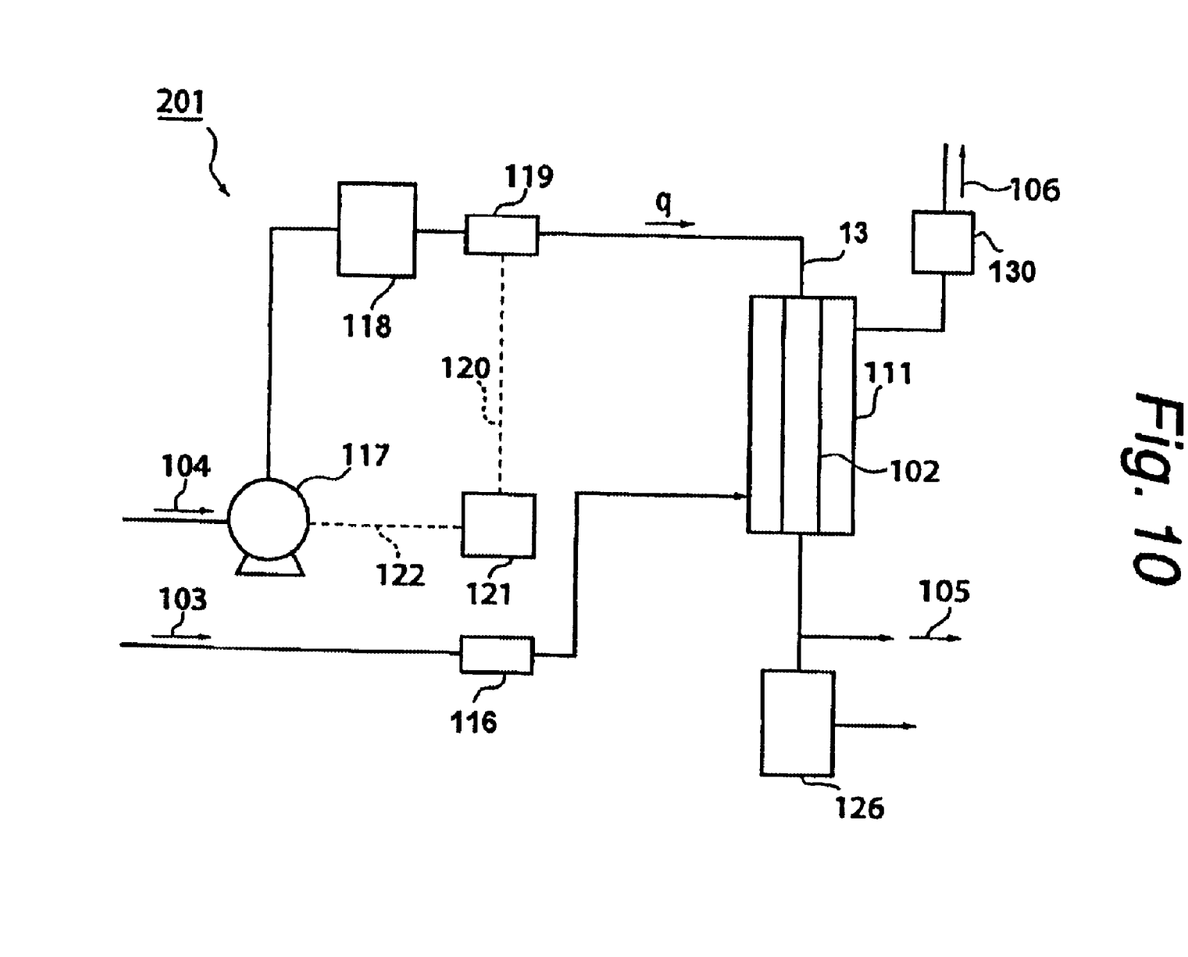
FIG. 10 is a flow diagram illustrating a configuration of a gas dissolved water producing apparatus according to a prior art.

As shown in FIG. 10, in a prior art gas dissolved water producing apparatus 201, a gas to be dissolved (hereafter referred to as solution gas) 103 is typically introduced into an outer side of a hollow fiber membrane 102 incorporated in a processing tank 111, and the gas is then dissolved through the hollow fiber membrane 102 into water to be treated 104 introduced into an inner side of the hollow fiber membrane 102, so as to produce a gas dissolved water 105.

The water to be treated 104 is fed by a pump 117 at a prescribed flow rate "q" to the inner side of the hollow fiber membrane 102 via a filter 118 and a flow meter 119. A flow rate signal 120 (illustrated by a broken line in the drawing) from the flow meter 119 is sent to a controller 121, which in turn sends a flow rate control signal 122 (illustrated by another broken line in the drawing) to a motor (not shown) for driving the pump 117, which is equipped with a revolution speed control unit (not shown). Therefore, the revolution speed of the motor can be controlled such that the pump 117 provides a prescribed flow rate "q".

The solution gas 103 passes through a flow meter 116, where a flow rate is controlled to a prescribed level, and is sent to an outer side of the hollow fiber membrane 102 approximately under an ambient pressure. The gas is dissolved in water to be treated 104 through the hollow fiber membrane 102, while a residual gas is decomposed in an exhaust gas decomposing tower 130 with the aid of a catalyst (not shown) and is emitted as an exhaust gas 106.

In the conventional gas dissolved water producing apparatus discussed above, a concentration of a solution gas dissolved in a produced aqueous solution (gas dissolved water) is a saturated concentration of a solution gas under a pressure for supplying the solution gas (typically an ambient pressure, which is a cleaning pressure under which cleaning is performed by using the gas dissolved water). However, in precision machineries, electronic industries, and medical and food industries, gentle cleaning of workpieces may be required so as to avoid any damage. Thus, it is desired to produce a gas dissolved water having a concentration of solution gas in a gas dissolved water not greater than a saturated concentration at a cleaning pressure. The need for such a cleaning process is especially necessary for device wafers such as semiconductor wafers, which have microfabricated wiring. There is therefore an increasing demand for cleaning by use of functional water, such as water containing nitrogen, water containing ozone, or water containing oxygen, with the concentration controlled to a desired level below a saturated concentration.

Such a gas dissolved water can be produced by, for example, the following procedures. After the solution gas has been supplied to the outer side of the hollow fiber membrane, supply of the solution gas is suspended, with only the water to be treated being continuously supplied to dissolve the solution gas into the water to be treated. Consequently, pressure in the outer side of the hollow fiber membrane decreases, and the solution gas dissolves into the water to be treated and reaches a saturated concentration under the decreased pressure level. Once the concentration has reached a desired value, the solution gas is again supplied into the outer side of the hollow fiber membrane, such that the pressure level can be maintained. As a result, the concentration of the solution gas dissolved in the gas dissolved water is made lower than a saturated concentration in the case of supplying the solution gas under ambient pressure. However, disadvantageously, it takes a long time for pressure in the outer side of the hollow fiber membrane to reach the above-described pressure which is lower than ambient pressure. Besides, there is also a fear that a gas other than the targeted solution gas may become mixed with the solution gas under a pressure lower than ambient pressure.

The present invention has been made in light of the situation described above, and has as its object the provision of a gas dissolved water producing apparatus and a method therefor which is capable of producing a gas dissolved water having a concentration of a dissolved solution gas not greater than a saturated concentration under ambient pressure, both rapidly and efficiently.

SUMMARY OF THE INVENTION

Figure 1:
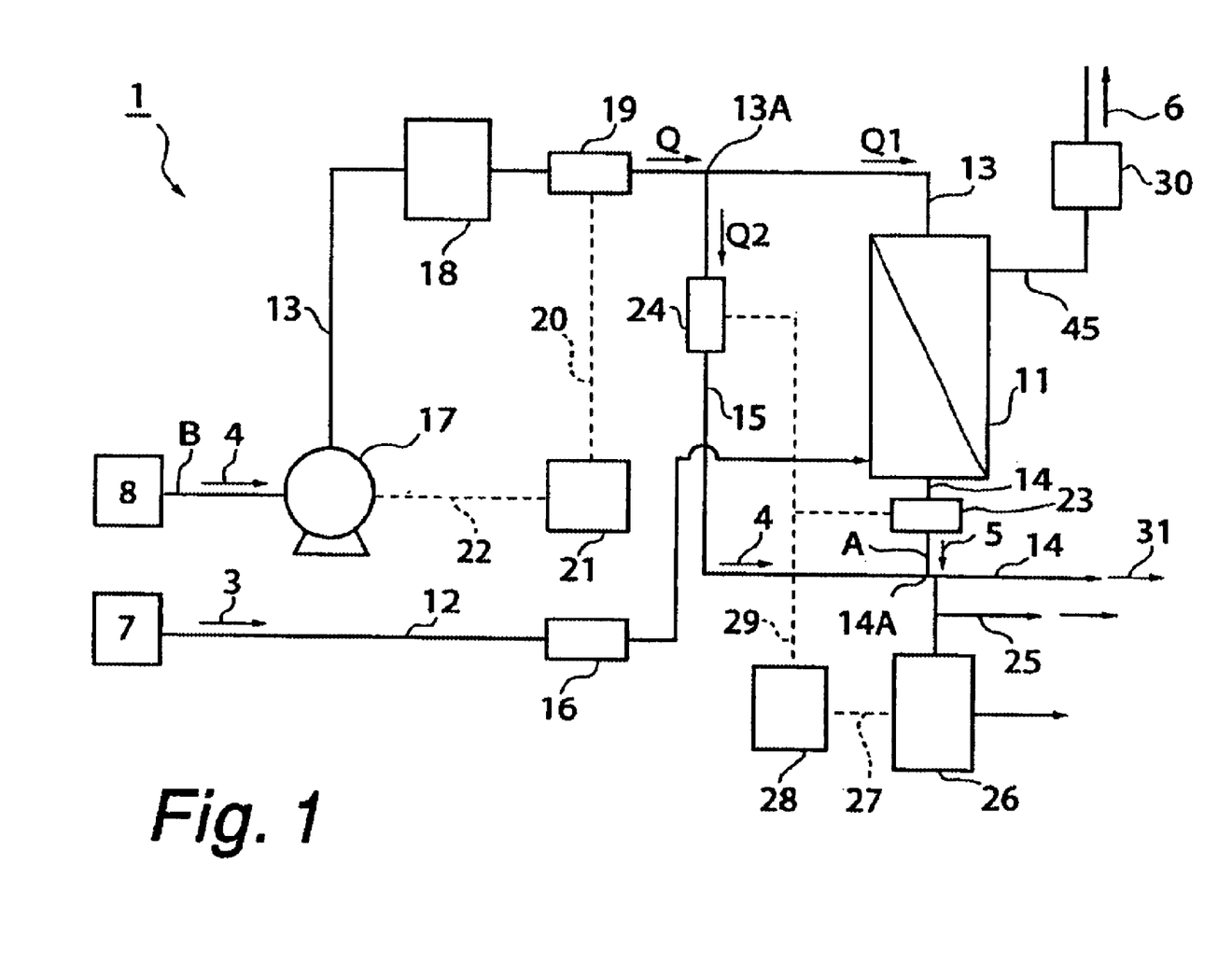
FIG. 1 is a flow diagram illustrating a configuration of a gas dissolved water producing apparatus of an embodiment according to the present invention.

To accomplish the object described above, according to the present invention, there is provided a gas dissolved water producing apparatus 1, in which a solution gas 3 is dissolved in water to be treated 4 so as to produce gas dissolved water 5. The apparatus includes, as shown in FIG. 1: a dissolving section 11 for dissolving the solution gas 3 into the water to be treated 4; a solution gas supply channel 12 for guiding the solution gas 3 into the dissolving section 11; a first supply channel for the water to be treated 13 for guiding the water to be treated 4 into the dissolving section 11; a gas dissolved water discharge channel 14 for guiding the gas dissolved water 5 from the dissolving section 11; and a second supply channel for the water to be treated 15 for guiding the water to be treated 4 without the water passing through the dissolving section 11. The second supply channel for the water to be treated 15 joins the gas dissolved water discharge channel 14, and the water to be treated 4 which has been guided through the second supply channel for the water to be treated 15 dilutes the gas dissolved water 5 so that the solution gas dissolved in the gas dissolved water 5 can be controlled to a prescribed level of concentration.

In the configuration described above, the apparatus includes the solution gas supply channel 12, the first supply channel for the water to be treated 13, the second supply channel for the water to be treated 15, and the gas dissolved water discharge channel 14, in which the second supply channel for the water to be treated 15 joins the gas dissolved water discharge channel 14. Thus, the solution gas dissolved in the gas dissolved water 5 can be diluted to a prescribed level of concentration with the water to be treated 4 which has been guided through the second supply channel for the water to be treated 15. As a result, the apparatus is able to produce a gas dissolved water 31 having a concentration of dissolved solution gas not greater than a saturated concentration, both rapidly and efficiently.

According to the present invention, there is also provided a gas dissolved water producing apparatus 1 as described above, in which, as shown in FIG. 1, the second supply channel for the water to be treated 15 is branched-off from the first supply channel for the water to be treated 13 so as to form a bypass channel 15 for bypassing the dissolving section 11.

With this configuration, since the second supply channel for the water to be treated 15 branches-off from the first supply channel for the water to be treated 13 to form the bypass channel 15 for bypassing the dissolving section 11, it is possible to simplify the channel configuration.

Figure 2:
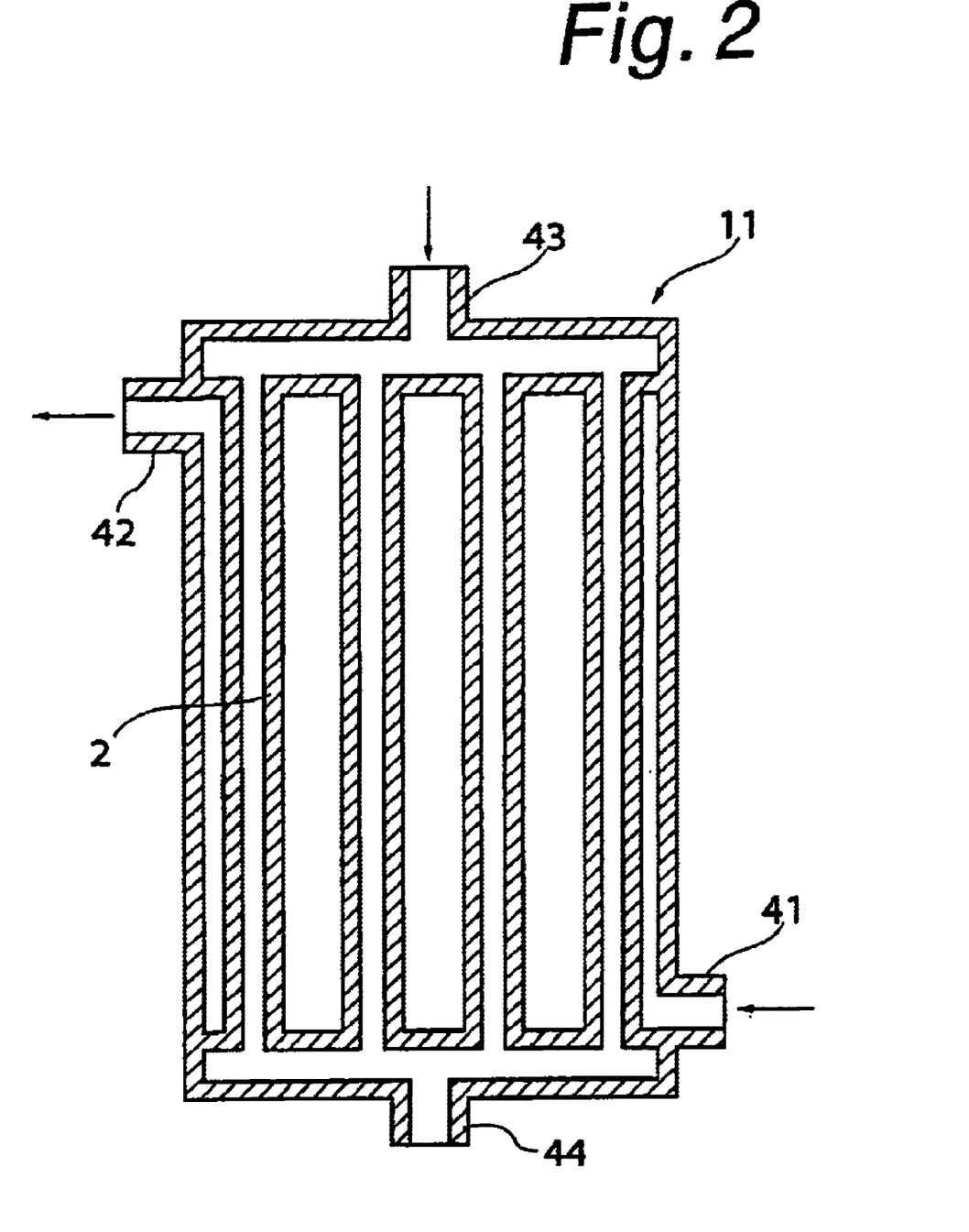
FIG. 2 is a schematic sectional view illustrating a configuration of a processing tank.

According to the present invention, there is also provided a gas dissolved water producing apparatus as described-above, in which, as shown in FIG. 1 and FIG. 2, the dissolving section 11 comprises a hollow fiber membrane 2 wherein the solution gas 3 is introduced into one side of the hollow fiber membrane 2, and the water to be treated 4 is introduced info the other side of the hollow fiber membrane 2 so as to generate the gas dissolved water 5.

The dissolving section 11 comprises the hollow fiber membrane 2, and the solution gas 3 is introduced into one side of the hollow fiber membrane 2 and the water to be treated 4 is introduced into the other side of the hollow fiber membrane 2, thereby generating the gas dissolved water 5. As a result, the apparatus is able to generate a gas dissolved water rapidly and efficiently that includes no residual minute air bubbles or impurities. It is to be noted that one side (the first side) of the hollow fiber membrane designates either the inner or the outer side thereof, and the other side (the second side) of the hollow fiber membrane designates a side opposite to the first side, either the outer or the inner side thereof.

According to the present invention, there is also provided a gas dissolved water producing apparatus 1 as described above, the apparatus further comprising, as shown in FIG. 1: either a first flow rate regulating means 23 or a second flow rate regulating means 24. The first flow rate regulating means 23 is disposed in the first supply channel for the water to be treated 13 at a downstream side of a branch section 13A or in the gas dissolved water discharge channel 14 at an upstream side of a joining section 14A where the second supply channel for the water to be treated 15 joins the gas dissolved water discharge channel 14, and functions to regulate a flow rate Q1 of the water to be treated 4 flowing through the dissolving section 11. The second flow rate regulating means 24 is disposed in the bypass channel 15 and functions to regulate a flow rate Q2 of the water to be treated 4 bypassing the dissolving section 11. A dissolved solution gas concentration measuring means 26 is disposed in the gas dissolved water discharge channel 14 at a downstream side of the joining section 14A for measuring the dissolved solution gas concentration in the gas dissolved water 31; and a second control means 28 is provided for controlling either the first flow rate regulating means 23 or the second flow rate regulating means 24, based on the dissolved solution gas concentration measured by the dissolved solution gas concentration measuring means 26. Therefore, the dissolved solution gas concentration can be controlled to the prescribed level.

By the configuration described above, since the apparatus comprises either the first flow rate regulating means 23 or the second flow rate regulating means 24, the dissolved solution gas concentration measuring means 26, and the second control means 28, the second control means 28 controls either the first flow rate regulating means 23 or the second flow rate regulating means 24 based on a dissolved solution gas concentration measured by the dissolved solution gas concentration measuring means 26 so that a dissolved solution gas concentration can be controlled to a prescribed level. Thus, the apparatus can produce the gas dissolved water 31 having a dissolved solution gas concentration not greater than a saturated concentration both rapidly and efficiently. It is to be understood that the gas dissolved water producing apparatus 1 may comprise both of the means 23, 24 (the first flow rate regulating means 23 and the second flow rate regulating means 24) and in such a case both of means 23 and 24 can be controlled in such a way that the dissolved solution gas concentration, as measured, can be controlled to a prescribed level.

To accomplish the object described above, according to the present invention, there is provided a gas dissolved water producing method comprising, as illustrated in FIG. 1: a first step of introducing the solution gas 3 into the dissolving section 11 where the solution gas 3 is to be dissolved into the water to be treated 4; a second step of introducing the water to be treated 4 into the dissolving section 11; a third step of dissolving the solution gas 3 into the water to be treated 4 in the dissolving section 11 to produce the gas dissolved water 5; and a fourth step of mixing the water to be treated 4 not passing through the dissolving section 11 into the gas dissolved water 5 so that the solution gas 3 dissolved in the gas dissolved water 31 after the mixing process can be controlled to the prescribed level of concentration.

According to the present invention, there is provided a gas dissolved water producing method according to the present invention, in which, as shown in FIG. 1, control in the fourth step is performed by controlling a ratio of the flow rate Q1 of the water to be treated 4 passing through the dissolving section 11 to the flow rate Q2 of the water to be treated 4 not passing through the dissolving section 11.

Figure 6:
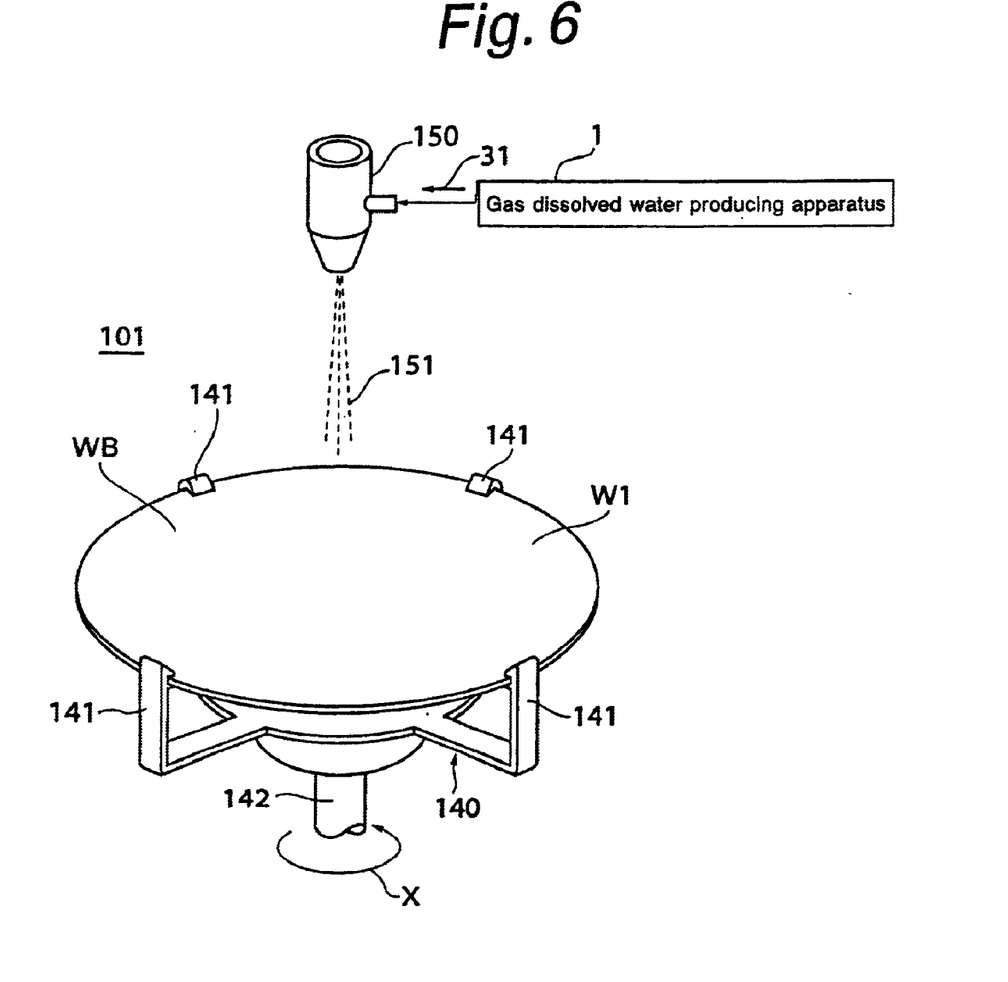
FIG. 6 is a perspective view of ultrasonic cleaning equipment for cleaning a wafer by using a gas dissolved water produced by the gas dissolved water producing apparatus of FIG. 1.
Figure 7:
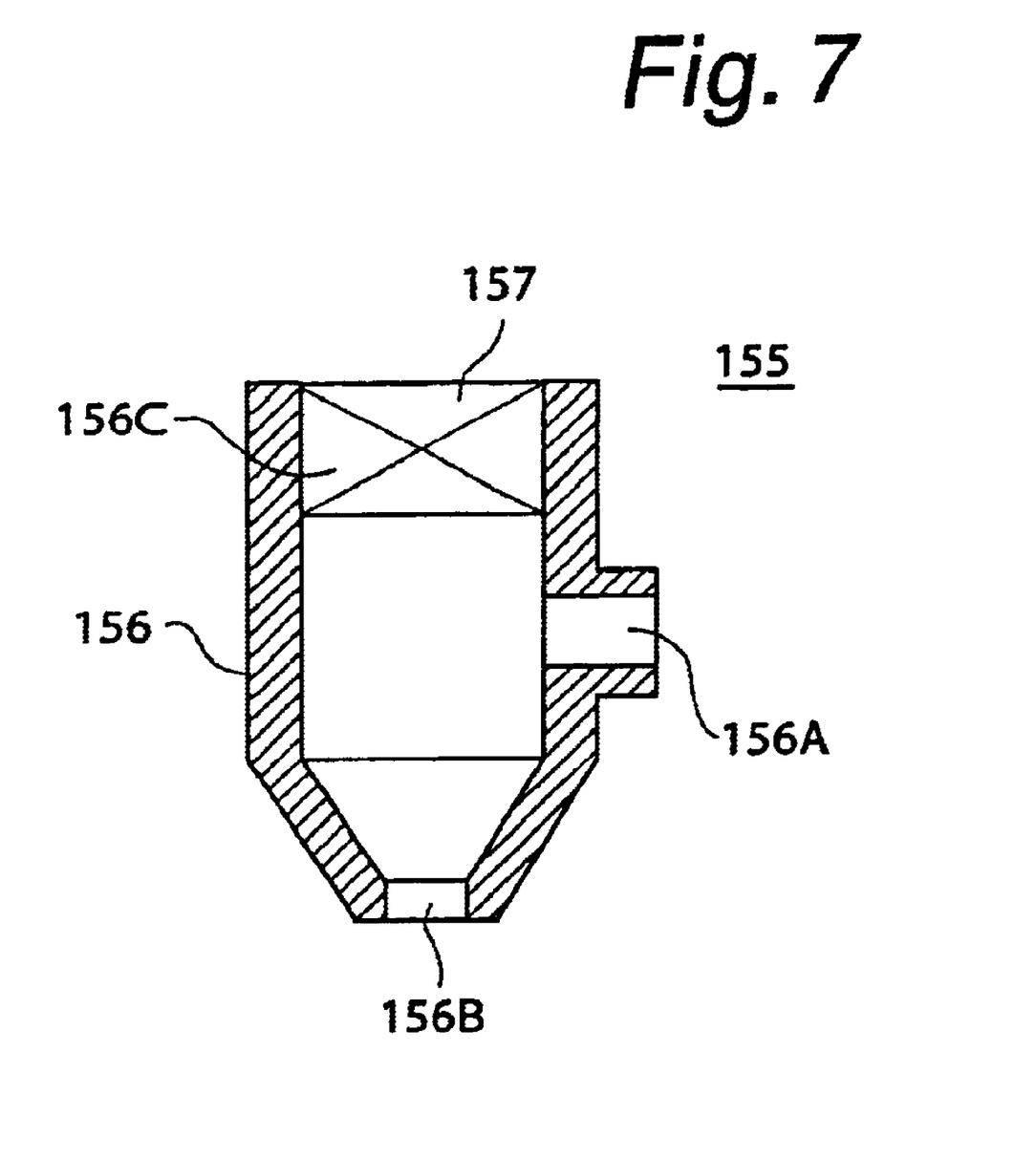
FIG. 7 is a sectional view of a mega sonic cleaning nozzle employed in the wafer cleaning equipment of FIG. 6.

To accomplish the object described above, according to the present invention, there is provided ultrasonic cleaning equipment 101 comprising, as shown in FIG. 6 and FIG. 7: a gas dissolved water producing apparatus 1 as described above; and an ultrasonic wave transmitting device 157 for imparting ultrasonic energy to the gas dissolved water 31 when a workpiece to be cleaned W1 is cleaned with the gas dissolved water 31 produced by the gas dissolved water producing apparatus 1.

With such a configuration, since the apparatus includes the gas dissolved water producing apparatus 1, and the ultrasonic wave transmitting device 157, and ultrasonic energy is imparted to the gas dissolved water 31, which has been produced by the gas dissolved water producing apparatus 1, when the workpiece to be cleaned W1 is to be cleaned with the gas dissolved water 31, the gas dissolved water 31 to which ultrasonic energy has been imparted can be used as a cleaning liquid, and the gas dissolved water 31 having a concentration controlled to the saturated concentration is suitable for use as a cleaning liquid, whereby the workpiece to be cleaned W1 can be more effectively cleaned. To accomplish the object described above, there is provided an ultrasonic cleaning method comprising: a producing step of producing the gas dissolved water according to the gas dissolved water producing method described above; an energy imparting process for imparting the ultrasonic energy to the gas dissolved water which has been produced by the producing process; and a cleaning process for cleaning the workpiece to be cleaned, by using the gas dissolved water to which the ultrasonic energy has been imparted in the energy imparting process, as the cleaning water.

DETAILED DESCRIPTION OF THE INVENTION

Preferred embodiments of the present invention will now be described below with reference to the attached drawings. It is to be appreciated that in respective drawings, those parts which are the same or similar to one another are designated by the same or similar reference numerals, and any duplicated descriptions will be omitted.

A configuration of a gas dissolved water producing apparatus 1 according to the present invention will be described with reference to FIG. 1. The gas dissolved water producing apparatus 1 comprises a processing tank 11 serving as a dissolving section with a hollow fiber membrane 2 (see FIG. 2) incorporated therein. A solution gas supply piping 12 serves as a solution gas supply channel for delivering a solution gas 3 from a solution gas source 7, and a supply piping for a water to be treated 13 serves as a first supply channel for the water to be treated for delivering the water to be treated 4 from a source of the water to be treated 8. A gas dissolved water discharge piping 14 serves as a gas dissolved water discharge channel for guiding a gas dissolved water 5, a bypass piping for the water to be treated 15 serves as a bypass channel, which branches off from the supply piping for the water to be treated 13 and bypasses the processing tank 11 or the hollow fiber membrane 2 to join the gas dissolved water discharge piping 14, and a gas dissolved water drain piping 25 branches off from the gas dissolved water discharge piping 14.

As shown in FIG. 2, the processing tank 11 has a first inlet nozzle 41 disposed in a lower side peripheral portion thereof, a first outlet nozzle 42 disposed in an upper side peripheral portion thereof, a second inlet nozzle 43 disposed in a top portion thereof, and a second outlet nozzle 44 disposed in a bottom portion thereof. A plurality of hollow fiber membranes 2 formed into a hollow cylinder with a thinner wall thickness are arranged in a vertical direction in the processing tank 11 so as to be incorporated therein.

The solution gas supply piping 12 is connected to the first inlet nozzle 41 of the processing tank 11 to communicate with the outer side of the hollow fiber membrane 2. The supply piping for the water to be treated 13 is connected to the second inlet nozzle 43 of the processing tank 11 to communicate with the inner side of the hollow fiber membrane 2. The gas dissolved water discharge piping 14 is connected to the second outlet nozzle 44 of the processing tank 11 to communicate with the outer side of the hollow fiber membrane 2. To the first outlet nozzle 42 of the processing tank 11 is connected an exhaust gas piping 45, which will be explained later.

Referring again to FIG. 1, the explanation will be continued. The bypass piping for the water to be treated 15 branches off at a branch section 13A from the supply piping for the water to be treated 13, and joins the gas dissolved water discharge piping 14 at a joining section 14A. Accordingly, assuming that a flow rate of the water to be treated 4 supplied to the supply piping for the water to be treated 13 is designated as "Q", a flow rate of the water to be treated 4 supplied from the supply piping for the water to be treated 13 to the inner side of the hollow fiber membrane 2 is designated as "Q1", and a flow rate of the water to be treated 4 branching off from the supply piping for the water to be treated 13 and flowing through the bypass piping for the water to be treated 15 is designated as "Q2", then a relationship Q=Q1+Q2 is established (including a case of Q1 or Q2 being equal to 0). In this embodiment, the flow rate of the gas dissolved water 5 flowing from the inner side of the hollow fiber membrane 2 into the gas dissolved water discharge piping 14 is Q1, and the flow rate of the gas dissolved water 31 which is discharged from the gas dissolved water discharge piping 14 after the water to be treated 4 having the flow rate Q2 joins and dilutes the gas dissolved water, is Q.

It is to be noted that the gas dissolved water exiting from the processing tank 11 and flowing through the gas dissolved water discharge piping 14 that has not yet reached the joining section 14A is indicated by the reference numeral 5, while the gas dissolved water that has joined the water to be treated 4 which has not passed through the processing tank 11, at the joining section 14A and has been diluted thereby is indicated by the reference numeral 31. It is also to be understood that even if a flow rate of the water to be treated 4 not passing through the processing tank 11 is zero and thus there is no dilution to be conducted, the gas dissolved water flowing through the gas dissolved water discharge piping 14 in the downstream side of the joining section 14A is still represented by the reference numeral 31.

A solution gas flow regulator 16 is installed in the solution gas supply piping 12 so as to regulate the flow rate of the solution gas 3 supplied to the outer side of the hollow fiber membrane 2, to the prescribed value. A pump 17 driven by a motor (not shown) is installed in the supply piping for the water to be treated 13 so as to pump the supplied water to be treated 4 into the processing tank 11. A filter 18 is installed in the supply piping for the water to be treated 13 at a downstream side of the pump 17 to eliminate foreign substances included in the water to be treated 4. A flow meter 19 is installed in the supply piping for the water to be treated 13 at a downstream side of the pump 17 for functioning as a flow rate measuring means, and the flow meter 19 sends a flow rate signal 20 (indicated by the broken line in the drawing) to a first controller 21 functioning as the first control means, which in turn sends a flow rate control signal 22 (indicated also by the broken line in the drawing) to the pump motor (not shown) equipped with a revolution speed control unit (not shown)(the signal is shown to be sent to the pump 17 in the drawing. Thus, the revolution speed of the motor can be controlled so that the discharge flow rate of the pump 17 (i.e., the supply flow rate Q of the water to be treated 4 to the gas dissolved water producing apparatus 1) can be regulated to the prescribed flow rate. It is to be noted that the pump 17, the filter 18, and the flow meter 19 are all located in the upstream side of the branch section 13A.

A first flow regulator for the water to be treated 23 functioning as the first flow rate regulating means is installed in the supply piping for the water to be treated 13 at a downstream side of the branch section 13A, and the second flow regulator for the water to be treated 24 functioning as the second flow rate regulating means is installed in the bypass piping for the water to be treated 15. Although the first flow regulator for the water to be treated 23 may be installed in the supply piping for the water to be treated 13 either at an upstream or a downstream side of the hollow fiber membrane 2, the installation in the downstream side of the hollow fiber membrane 2, as illustrated, is preferable because the water pressure applied to the hollow fiber membrane 2 can be increased. Therefore, the solution gas 3 can be supplied at a relatively higher pressure while maintaining the relationship: the water pressure of the water to be treated 4 > the gas pressure of the solution gas 3.

The gas dissolved water discharge piping 14 is connected to a gas dissolved water concentration meter 26 serving as a dissolved solution gas concentration measuring means for measuring the concentration of the solution gas 3 dissolved in the gas dissolved water 31, and the gas dissolved water concentration meter 26 sends a concentration signal 27 to a second controller 28 serving as a second control means. The gas dissolved water concentration meter 26 measures the concentration of the gas dissolved water 31 after having been diluted. The second controller 28 sends a second flow rate control signal 29 to the first flow regulator for the water to be treated 23 and the second flow regulator for the water to be treated 24. Upon receiving the second flow rate signal 29, the first and the second flow regulators of the water to be treated 23 and 24 regulate the ratio of the flow rate Q1 of the water to be treated 4 flowing through the first flow regulator for the water to be treated 23 to the flow rate Q2 of the water to be treated 4 flowing through the second flow regulator for the water to be treated 24, so that the concentration detected by the gas dissolved water concentration meter 26 can be controlled to the prescribed concentration.

The exhaust gas 6 exiting from the outer side of the hollow fiber membrane 2 is exhausted via exhaust gas piping 45. In the case that the exhaust gas contains a noxious gas, such an exhaust gas should be treated in a gas decomposing tower 30 filled with a catalyst or the like (not shown) to decompose the noxious gas before emitting the gas to the atmosphere.

An operation of the gas dissolved water producing apparatus 1 will now be described.

The solution gas 3 is supplied to the solution gas supply piping 12, and the supplied solution gas 3 is, after the flow rate thereof having been regulated by the solution gas flow regulator 16, delivered to the outer side of the hollow fiber membrane 2 incorporated in the processing tank 11, at a prescribed flow rate. The water to be treated 4 is supplied to the supply piping for the water to be treated 13, and the supplied water to be treated 4 is compressed by the pump 17 and is passed through the filter, where the foreign substances, if any, included in the water to be treated 4 are eliminated, and further through the flow meter 19. The flow rate Q of the water to be treated 4 supplied to the gas dissolved water producing apparatus 1 is measured by the flow meter 19, and the flow rate signal 20 is sent (fed back) to the first controller 21. The first controller 21 determines a difference between a measured flow rate and a flow rate of a control target value, and sends a first flow rate control signal based on the determined difference to the motor (not shown) for driving the pump 17, so that the motor may drive the pump 17 at the controlled revolution speed.

The PID control system is employed to control the revolution speed of the motor in a stepless manner such that, for example, the revolution speed is increased if the measured flow rate is lower than the flow rate of the control target, and the revolution speed is decreased if the measured flow rate is greater than the flow rate of the control target.

The water to be treated 4 passes through the flow meter 19, and then a part thereof (corresponding to the flow rate Q1) passes through the inner side of the hollow fiber membrane 2 in the processing tank 11 to flow into the first flow regulator for the water to be treated 23, and the rest of the water to be treated 4 (corresponding to the flow rate Q2) flows into the bypass piping for the water to be treated 15 branched off from the supply piping for the water to be treated 13, and passes through the flow regulator for the water to be treated 24 to bypass the hollow fiber membrane 2. The water to be treated 4, which has absorbed the dissolved solution gas 3 through the hollow fiber membrane 2 while passing through the inner side of the hollow fiber membrane 2 and thus has been formed into the gas dissolved water 5, is then discharged from the inner side of the hollow fiber membrane 2 and then flows through the gas dissolved water discharge piping 14 to join the water to be treated 4 which has bypassed the hollow fiber membrane 2 at the joining section 14A. Thus, the concentration of the dissolved solution gas in the gas dissolved water 5 is diluted. Further, the gas dissolved water 5 flows through the gas dissolved water discharge piping 14 to be finally supplied to cleaning equipment (not shown).

The gas dissolved water concentration meter 26 connected to the gas dissolved water discharge piping 14 measures the concentration of the dissolved solution gas after the dilution, and the gas dissolved water concentration meter 26 then sends a concentration signal 27 to the second controller 28. The second controller 28 determines the difference between a measured concentration and a concentration of a control target value, calculates a second flow rate control signal 29 based on the determined difference by using an incorporated arithmetic circuit (though not shown) and sends the second flow rate control signal 29 to the first and the second flow regulators of the water to be treated 23 and 24 so as to accomplish control in the following manner.

That is, in effecting control, if the measured concentration is lower than that of the control target, the flow rate Q1 of the water to be treated 4 flowing through the inner side of the hollow fiber membrane 2 (the flow rate passing through the first flow regulator for the water to be treated 23) is increased, and the flow rate Q2 of the water to be treated 4 bypassing the hollow fiber membrane 2 (the flow rate passing through the second flow regulator for the water to be treated 24) is decreased. If the measured concentration is greater than that of the control target, then the flow rate Q1 of the water to be treated 4 flowing through the inner side of the hollow fiber membrane 2 is decreased and the flow rate Q2 of the water to be treated 4 bypassing the hollow fiber membrane 2 is increased. The flow rates are controlled in this manner to adjust the concentration of the dissolved solution gas 3 in the gas dissolved water 31 to the prescribed value. Controlling the concentration of the dissolved solution gas 3 in the gas dissolved water 31 to the prescribed value, results in controlling the pressure of the gas dissolved water 5, 31 to a prescribed pressure. It is to be noted that, preferably, the overall gas dissolved water producing apparatus 1 should be operated automatically.

If the concentration data of the water to be treated 4 and the saturated gas dissolved water 5 are collected regularly and alternately at, for example, the locations indicated as B and A in the drawing, respectively, and are continuously updated by using the gas dissolved water concentration meter 26 while the gas dissolved water 31 is not produced, then the gas dissolved water 31 having the prescribed level of dissolved solution gas concentration could be produced and supplied in a short time, even in a case in which a dissolved solution gas concentration of the water to be treated 4 supplied from the source of the water to be treated 8 is changed, or in a case in which the water temperature and thus the dissolved solution gas concentration of the saturated gas dissolved water 5 is changed.

For example, if a concentration of the solution gas desired to be dissolved, such as $N_2$ and $O_2$, in the water to be treated 4 from the source of the water to be treated 8 is increased, a flow rate distribution may be controlled such that the flow rate of Q1 is decreased and the flow rate of Q2 for bypassing is increased. Similarly, if the concentration of the saturated gas dissolved water 5 is increased, then the Q1 is decreased and the Q2 is increased. Further, if the water temperature of the gas dissolved water 5 is increased, the saturated concentration of the gas allowed to remain as dissolved in the hollow fiber membrane 2 (see FIG. 2) will be substantially lowered, and then the Q1 is increased and the Q2 for bypassing is decreased. A total number of three dissolved solution gas concentration meters 26 for measuring the concentrations of the water to be treated 4, the saturated gas dissolved water 5, and the gas dissolved water after the dilution 31, respectively, may be arranged on the basis of one for each appropriate location. Alternatively, a single dissolved solution gas concentration meter 26 may be employed, and the locations for measurement may be switched between one another as needed. In the preceding discussion, the dissolved gas concentration meter 26 may be arranged so as to measure the concentration and/or temperature of the gas dissolved water 31 alternatively.

In the gas dissolved water producing apparatus 1 according to this embodiment, the ultrapure water to which the degassing process has been applied is preferably used as the water to be treated 4. In the present apparatus 1, the concentration levels in the water to be treated 4 at the inlet port of the supply piping for the water to be treated 13 are controlled to be below 3 ppm for nitrogen, below 100 ppb for oxygen, and below 1 ppb for hydrogen, respectively. The water to be treated 4 is controlled such that the supply flow rate Q is 20 to 30 L/min, the supply temperature is in a range of 20 to 23° C., and the supply pressure is in a range of 0.20 to 0.30 MPa (2.0 to 3.0 kgf/cm$^2$) (by gage pressure).

The nitrogen gas (case 1) or the hydrogen gas (case 2) each having an approximately 100% purity were used as the solution gas 3. It is preferable that the solution gas to be supplied has a purity of 99% or higher. Alternatively, argon gas, oxygen gas or carbon dioxide gas may be used as the solution gas 3. The supply pressure of the solution gas 3 is 0.00 MPa (0.00 kgf/cm$^2$) (by gage pressure), which is equivalent to the ambient-pressure. The supply pressure of the water to be treated 4 is set to be higher than the solution gas pressure by 0.20 to 30 MPa (2.0 to 3.0 kgf/cm$^2$). Setting the supply pressure of the water to be treated 4 to be higher than the solution gas pressure by 0.01 MPa (0.1 kgf/cm$^2$) or more can supply a gas dissolved water that includes no minute air bubbles or impurities and still has a uniform concentration. Preferably, the supply pressure of the solution gas 3 is typically higher than the ambient pressure, because in this case the supply method can be simplified.

In the present gas dissolved water producing apparatus 1, a section in contact with the liquid is made of a non-metal material so as to avoid a problem of metal ions being released into the water to be treated 4. The pump 17 is controlled in a stepless variable speed controlling manner, and is designed as a non-particle type using a dynamic pressure bearing to eliminate any mechanical contacts of rotors so as to inhibit generation of minute particles from the inside of the pump. A highly purified ceramic and a tetrafluoride resin are used for the material of the liquid contacting section to avoid a problem of metal ions being released into the water to be treated 4. The filter 18 comprises a membrane filter having a nominal filtration rating of 0.05 $\mu$m. As for the hollow fiber membrane, it is preferable to use a hollow fiber membrane made of Teflon, a porous hydrophobic membrane (pore size distribution of 0.01 to 1 $\mu$m) made of polytetrafluoroethylene or the like. As for the material of the piping, it is preferable to use the piping made of PVDF (polyvinylidenfluoride, fluororesin) which has excellent air-tightness and a relatively low permeability against the gas from the outside.

According to the gas dissolved water producing apparatus 1 of the present embodiment, if nitrogen gas is used as the solution gas 3 (case 1), the gas dissolved water 31 having the nitrogen gas concentration of 5 to 20 ppm (at the water temperature of 20° C.) can be produced efficiently in a short period. Alternatively, if hydrogen gas is used as the solution gas (case 2), the gas dissolved water 31 having a hydrogen gas concentration of 100 to 1000 ppb (at the water temperature of 20° C.) can be produced efficiently in a short period.

Figure 3:
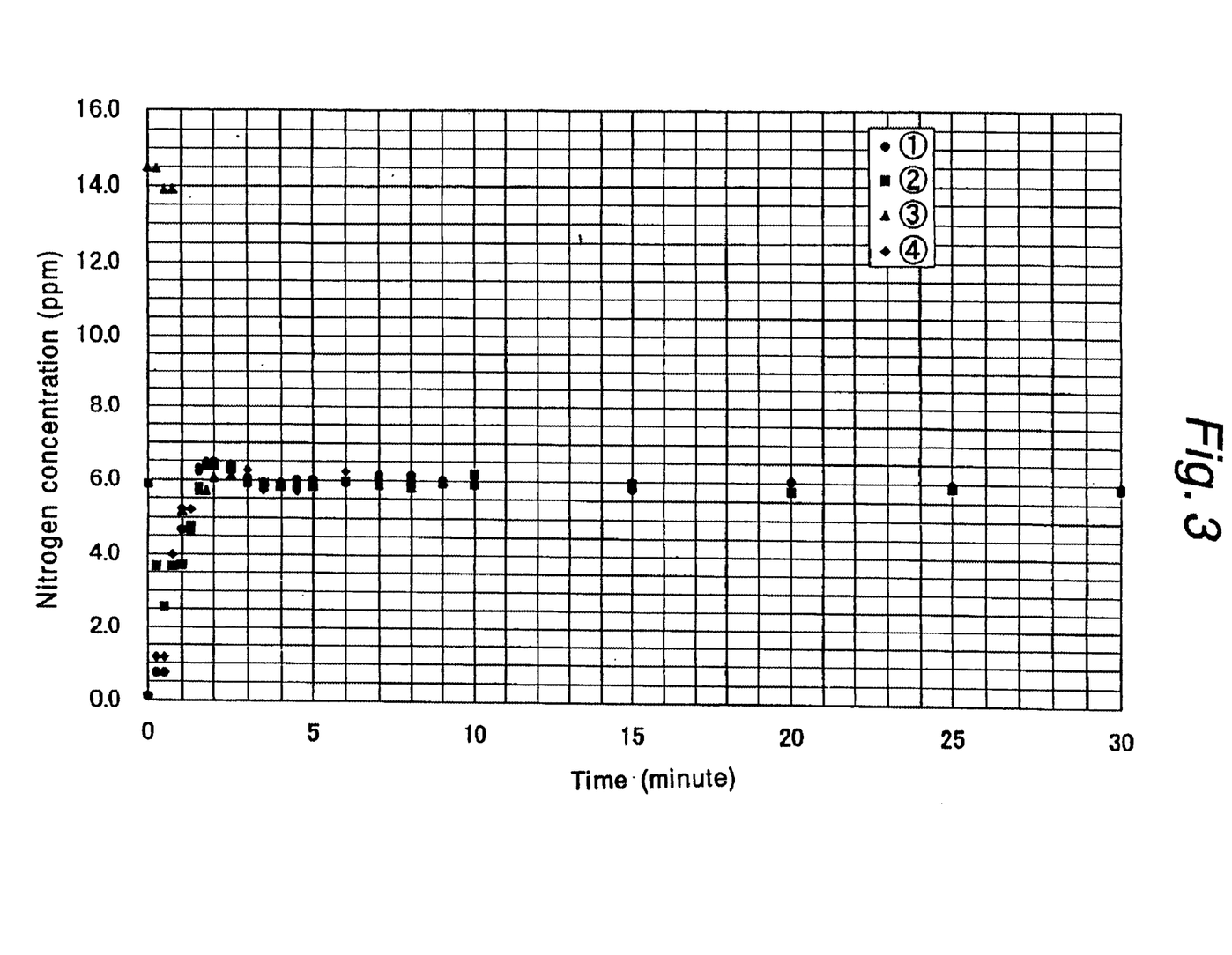
FIG. 3 is a diagram illustrating an experimental data of a nitrogen gas concentration as a function of time, in the case where nitrogen gas is used as a solution gas for producing a gas dissolved water with a nitrogen gas concentration of 6 ppm, in the gas dissolved water producing apparatus of the present invention.
Figure 4:
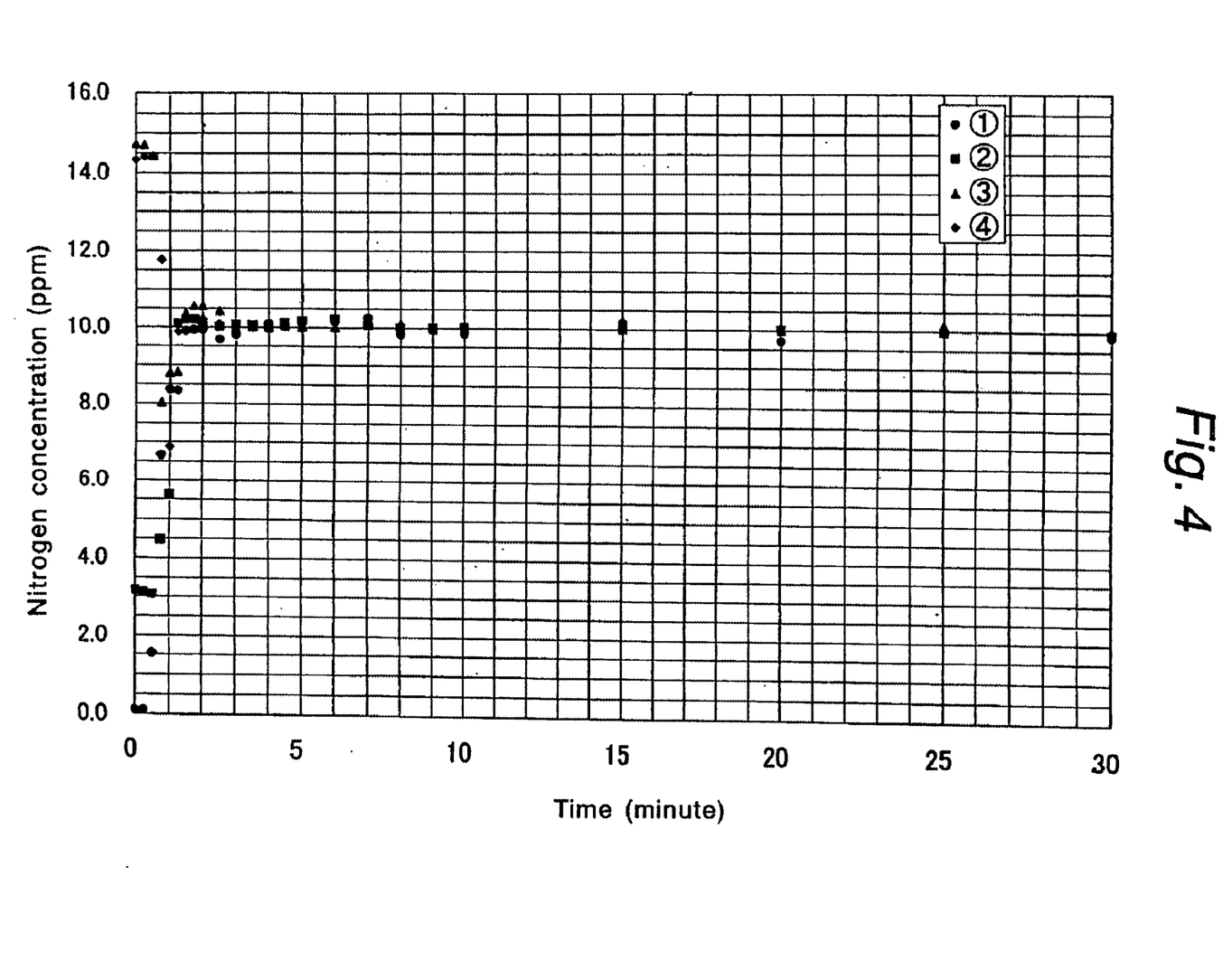
FIG. 4 is a diagram illustrating other experimental data of a nitrogen gas concentration as a function of time, in the case where the nitrogen gas is used as the solution gas for producing the gas dissolved water with the nitrogen gas concentration of 10 ppm, in the gas dissolved water producing apparatus of the present invention.
Figure 5:
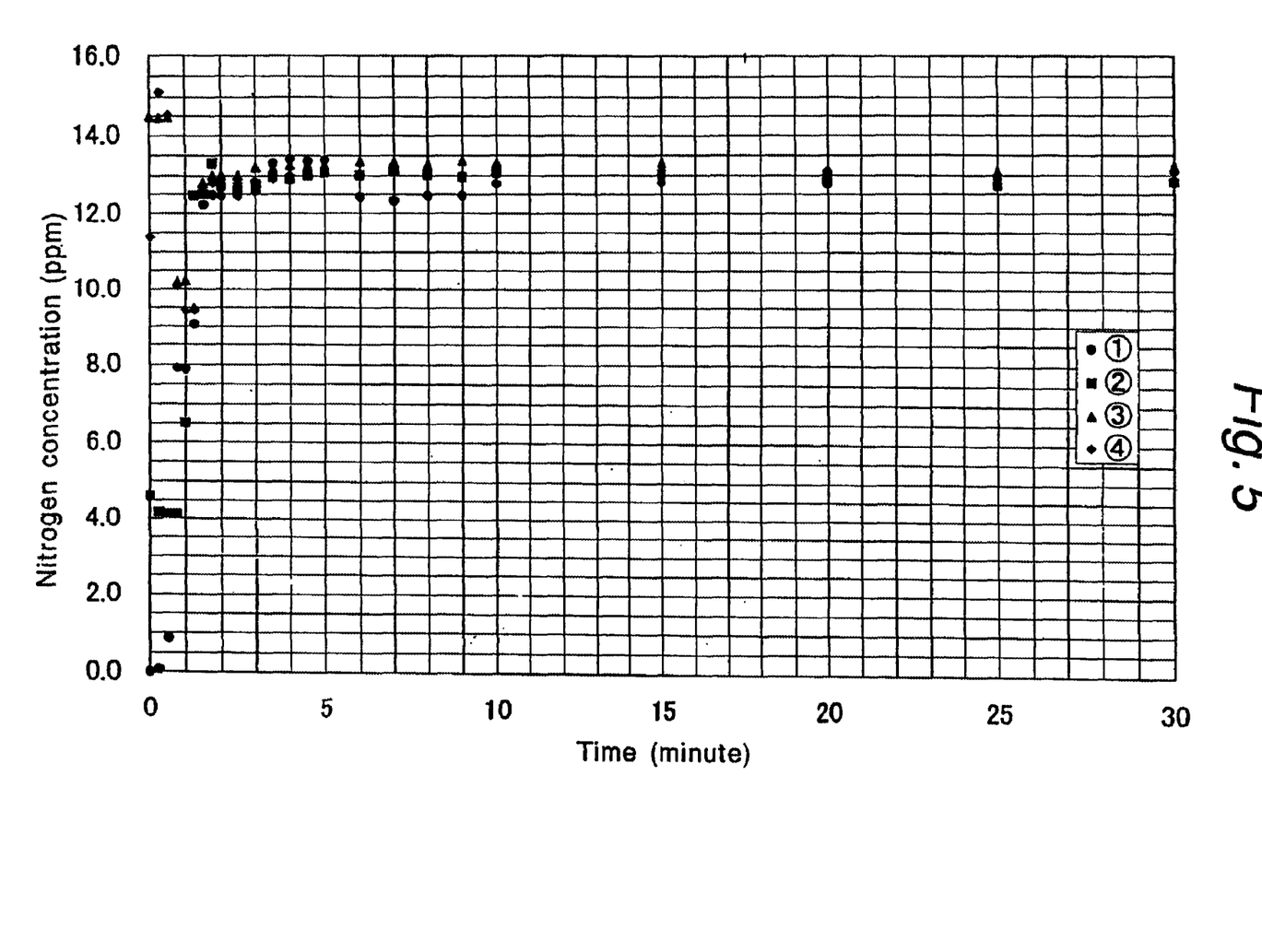
FIG. 5 is a diagram illustrating still another experimental data of a nitrogen gas concentration as a function of time, in the case where the nitrogen gas is used as the solution gas for producing the gas dissolved water with the nitrogen gas concentration of 13 ppm, in the gas dissolved water producing apparatus of the present invention.

FIGS. 3 to 5 show experimental results from the measurement of the concentrations varying over time in the case of using nitrogen gas (case 1). Respectively, the figures illustrate the case for producing the gas dissolved water 31 having a concentration of 6 ppm at a water temperature of 20° C. (FIG. 3), the case for producing the gas dissolved water 31 having a concentration of 10 ppm at the water temperature of 20° C. (FIG. 4), and the case for producing the gas dissolved water 31 having a concentration of 13 ppm at a water temperature of 20° C. (FIG. 5). In FIGS. 3 to 5, the x-axis indicates the time (unit by minutes), and the y-axis indicates the dissolved nitrogen gas concentration (unit by ppm). Further, in the respective drawings, the supply flow rate of the water to be treated was set to be 20 L/min and the measurements were repeated four times, which are represented by the data ① to ④. In respective cases, as can be seen from the data, the gas dissolved water 31 of the targeted concentration can be produced in a time of around 1 to 1.5 minutes.

It is to be appreciated that if the solution gas is not a 100% purified gas, the concentration of the solution gas dissolved in the gas dissolved water would be a saturated concentration based on a partial pressure of the solution gas in the supplied gas. Needless to say, the gas supplied to the solution gas supply piping may be a mixed gas.

The first flow regulator for the water to be treated 23 in the supply piping for the water to be treated 13 may be a control valve for controlling the flow rate in response to the second flow rate control signal 29 from the second controller 28. The second flow regulator for the water to be treated 24 in the bypass piping for the water to be treated 15 may also be a control valve for controlling the flow rate in response to the second flow rate control signal 29 from the second controller 28. Instead of the two control valves being disposed independently in respective pipings, a single three-way control valve functioning as a flow rate controlling means of the water to be treated may be installed in the branch section 13A of the supply piping for the water to be treated 13. In that case, the three-way control valve serves as the first flow rate regulating means as well as the second flow rate regulating means. In this regard, the branch section 13A is considered to be a part of the supply piping for the water to be treated 13 and a part of the bypass piping for the water to be treated 15, as well.

It is to be appreciated that the gas dissolved water producing apparatus 1 of the present invention may also be utilized as a degassed water supplying apparatus by switching the flow directions such that all the flow toward the supply piping for the water to be treated 13 may be directed and passed through the bypass piping for the water to be treated 15. Further, the apparatus according to the present invention can also produce a saturated gas dissolved water 31 by switching the flow directions so that all the flow originally directed to the supply piping for the water to be treated 13 can be introduced into the inner side of the hollow fiber membrane 2. Although, in this embodiment, the apparatus has the configuration in which the supply piping for the water to be treated 13 for producing the gas dissolved water 31 and the bypass piping for the water to be treated 15 are branched off from the common source of the water to be treated 8, the present invention is not limited to the particular mode shown in FIG. 1 in which the bypass piping of the processing tank 11 is provided. In fact, one piping section of the water to be treated which is connected to the processing tank 11 for producing the saturated gas dissolved water and the other piping section of the water to be treated for dilution may be connected to separate sources of water to be treated so as to be supplied therefrom, respectively.

Ultrasonic cleaning equipment for wafer 101, 102 will now be described as an example for applying the gas dissolved water with its concentration controlled to be below the saturated concentration, which has been produced according to the present invention. The gas dissolved water obtained by way of the present invention is especially suitable for cleaning device wafers.

FIG. 6 shows a perspective view of the ultrasonic cleaning equipment for wafer 101 serving as an ultrasonic cleaning device. Referring to FIG. 6, the ultrasonic cleaning equipment for wafer 101 comprises a rotary chuck 140 having four chuck pawls 141 and a shaft 142 on which the rotary chuck 140 is mounted. The rotary chuck 140 is designed to carry a semiconductor wafer W1 thereon with the chuck pawls 141 clamping a periphery WA of the wafer W1, and to rotate in the direction indicated by the arrow X as centered on the shaft 142. The ultrasonic cleaning equipment for wafer 101 further comprises a cleaning liquid injecting nozzle 150, and is designed such that a cleaning liquid 151 may be injected from the cleaning liquid injecting nozzle 150 against a surface to be cleaned WB of the semiconductor wafer W1 (hereinafter sometimes referred to as an upper surface WB).

In the ultrasonic cleaning equipment for wafer 101, for example, after having been polished, the semiconductor wafer W1 is placed with the surface to be cleaned WB up and securely clamped at the periphery thereof by the chuck pawls 141 of the rotary chuck 140. While the rotary chuck 140 is being rotated in the direction indicated by the arrow X, the cleaning liquid 151 is injected from the cleaning liquid injecting nozzle 150 against the upper surface WB of the semiconductor wafer W1 to wash off abrasive grains and shavings held on the upper surface WB of the semiconductor wafer W1. Hereinafter, an application in the mega sonic cleaning will be described.

FIG. 7 is a sectional view illustrating a detailed configuration of a mega sonic cleaning nozzle 155 used in the ultrasonic cleaning equipment for a wafer 101 of FIG. 6. Referring to FIG. 7, the mega sonic cleaning nozzle 155 is configured such that an ultrasonic vibrator 157 is mounted on a rear end portion 156C of a nozzle main body 156 so as to function as an ultrasonic wave transmitting device. When the ultrasonic vibrator 157 is activated and the gas dissolved water 31 (see FIG. 1) from the gas dissolved water supply line 14 (see FIG. 1), after the concentration thereof has been adjusted as shown in FIG. 1, is introduced into an inlet port 156A formed in the nozzle main body 156, thereby an ultrasonic vibration energy is imparted to the gas dissolved water 31. Therefore, the cleaning liquid 151 (see FIG. 6) to which the ultrasonic vibration energy has been imparted can be injected from an injection port 156B formed in the nozzle main body 156 against the upper surface WB of the semiconductor wafer W1. It is to be noted that the gas dissolved water 31 is injected as the cleaning liquid 151.

In this way, the ultrasonic energy is indirectly imparted to any dust existing on the upper surface WB of the semiconductor wafer W1 through the injected cleaning liquid 151 (see FIG. 6). As a result, the dust on the semiconductor wafer W1 is vibrated and released from the upper surface WB of the semiconductor wafer W1, and will be washed away by the injected cleaning liquid 151.

In this case, a gas dissolved water containing, for example, $N_2$ as the solution gas may be used as the cleaning liquid. In that case, air bubbles are liable to be formed in the cleaning liquid if the concentration of the gas dissolved therein is too high. In such an event that the generated air bubbles gather to form large air bubbles and/or the generated air bubbles adhere to the surface being cleaned WB, the portion of the semiconductor wafer W1 having the air bubbles adhering thereto is prohibited from being cleaned uniformly as compared to the other portions of the wafer W1 having no air bubbles adhering thereto.

To deal with this case, if the gas dissolved water with its concentration controlled to be equal to or less than the saturated concentration is used in the above-discussed mega jet cleaning, as is the case with the present invention, it may help inhibit the formation of air bubbles, or at least limit the formation of large-diameter bubbles. Thus, cleaning of the minute concavities and convexities on the device wafer having micro-fabricated patterns may be performed in a gentle and uniform manner. In other cleaning cases, the gas dissolved water with the concentration not greater than the saturated concentration should preferably be used to clean a device wafer particularly having a micro-fabricated patterned surface.

Figure 8:
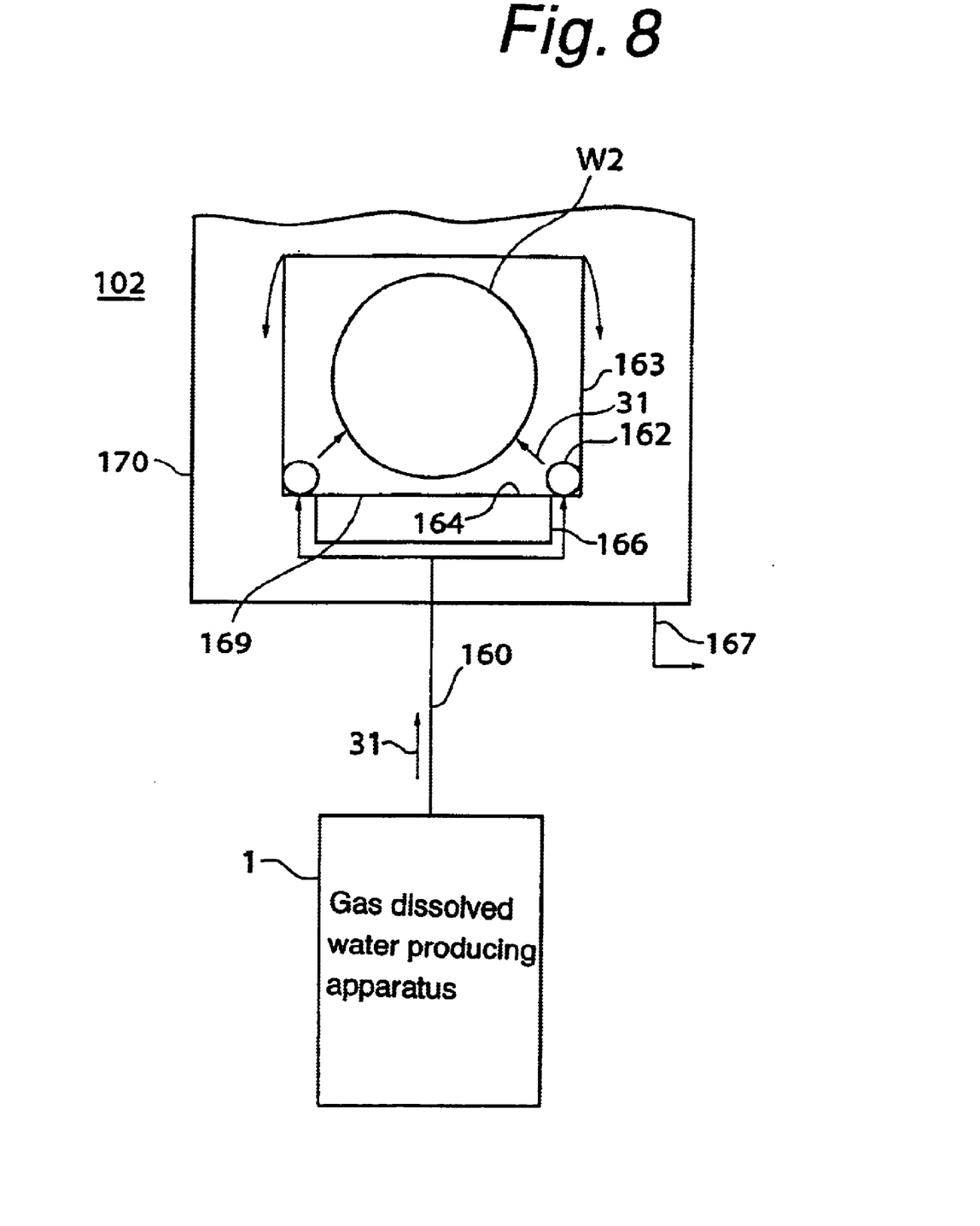
FIG. 8 is a block diagram illustrating a configuration of an ultrasonic cleaning equipment for a wafer according to another embodiment of the present invention.

FIG. 8 shows another example of ultrasonic cleaning equipment for wafer 102 as an alternative embodiment of the ultrasonic cleaning device. The ultrasonic cleaning equipment for wafer 102 comprises a gas dissolved water producing apparatus 1, a cleaning bath 163, a cleaning liquid supply line 160 interconnecting the gas dissolved water producing apparatus 1 and the cleaning bath 163, and a drain tank 170 arranged to house the cleaning bath 163 therein.

A gas dissolved water 31 (e.g., nitrogen containing water) with the concentration thereof controlled to be no greater than the saturated concentration, which has been produced in the gas dissolved water producing apparatus 1 of the present invention, is supplied into the cleaning bath 163 from a cleaning liquid supply nozzle 162 attached thereto via the gas dissolved water supply line 160.

Figure 9:
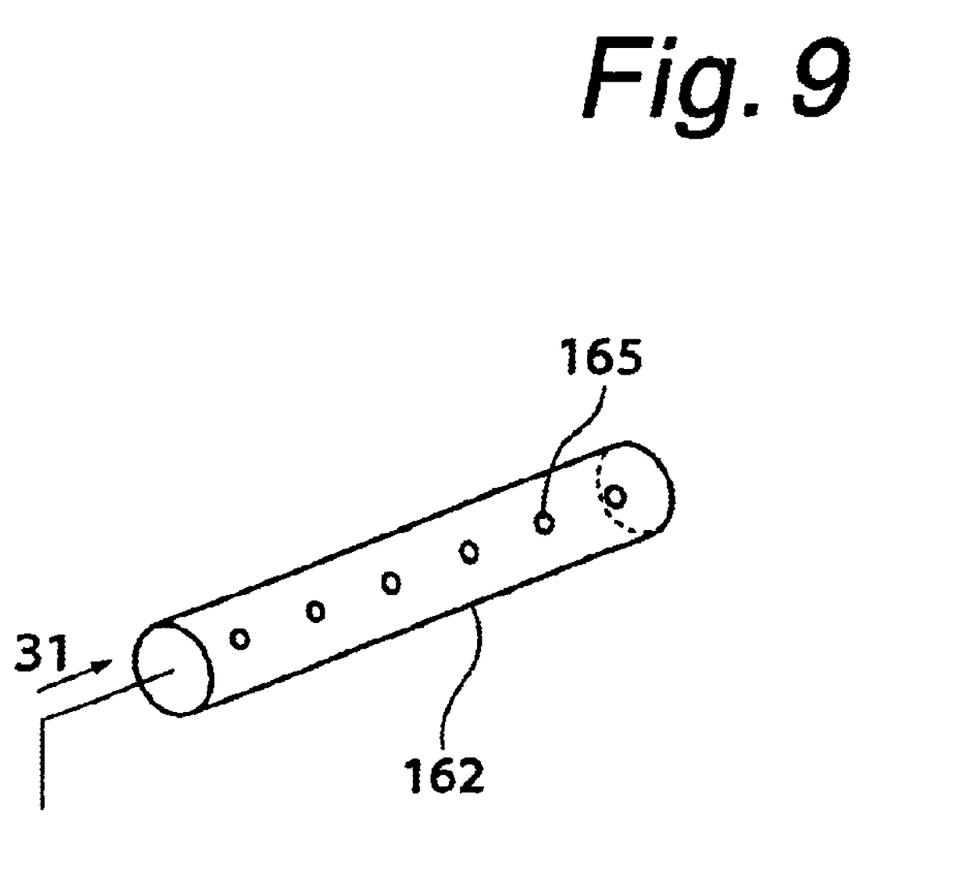
FIG. 9 is a perspective view of a cleaning liquid supply nozzle employed in the ultrasonic cleaning equipment of FIG. 8.

The cleaning liquid supply nozzle 162 (see FIG. 9) is a cylindrical nozzle lying along an inner bottom surface 164 of the cleaning bath 163. This cleaning liquid supply nozzle 162 includes a plurality of discharge ports 165 along a longitudinal direction thereof (see FIG. 9), and the gas dissolved water 31 is supplied as the cleaning liquid 31 from the discharge ports 165 into the cleaning bath 163. An ultrasonic vibrator 166 functioning as an ultrasonic wave transmitting device is disposed on a lower face 169 of the cleaning bath 163, and the ultrasonic vibrator 166 imparts ultrasonic vibration energy to the cleaning liquid 31 in the cleaning bath 163.

Typically, 25 device wafers W2 to be cleaned (for example, silicon wafers) are placed in the cleaning bath 163 in the vertically upright position. Then, the cleaning bath 163 is filled with the cleaning liquid 31 and cleaning liquid which overflows from the cleaning bath 163 is recovered in the drain tank 170 arranged to house the cleaning bath 163 therein. The cleaning liquid 31 recovered in the drain tank 170 is discharged from the drain line 167 connected to the drain tank. The ultrasonic cleaning equipment for wafer 102 of this embodiment provides an advantageous effect that a large number of device wafers W2 can be cleaned quickly thereby improving a throughput, in addition to the advantages similar to those provided by the preceding ultrasonic cleaning equipment for wafer 101.

Advantageous Effects of the Invention

As discussed above, since the gas dissolved water producing apparatus according to the present invention comprises the solution gas supply channel, the first supply channel for the water to be treated, the second supply channel for the water to be treated, and the gas dissolved water discharge channel, and because the second supply channel for the water to be treated joins the gas dissolved water discharge channel so that the water to be treated guided by the second supply channel for the water to be treated can dilute the gas dissolved water until the concentration of the solution gas in the gas dissolved water reaches a prescribed concentration, the gas dissolved water producing apparatus is able to rapidly and efficiently produce a gas dissolved water that has a concentration of dissolved solution gas not greater than a saturated concentration.

As discussed above, the ultrasonic cleaning equipment according to the present invention comprises the gas dissolved water producing apparatus of the present invention and the ultrasonic wave transmitting device. Thus, when a workpiece to be cleaned is cleaned with the gas dissolved water produced by the gas dissolved water producing apparatus of the present invention, the ultrasonic energy is imparted to the gas dissolved water. Therefore, the gas dissolved water controlled to have a saturated concentration suitable for cleaning can be used as a cleaning liquid. Further, a gas dissolved water to which the ultrasonic energy has been imparted can be used as a cleaning liquid, so that the workpiece to be cleaned can be cleaned more cleanly.

What is claimed is:

1. A gas-dissolved water producing apparatus comprising:
 a dissolving section for dissolving a solution gas into water to form gas-dissolved water;
 a solution gas supply channel for guiding the solution gas into said dissolving section;
 a water supply channel for guiding the water, said water supply channel including:
  a first supply channel for guiding the water into said dissolving section; and
  a second supply channel for guiding the water around said dissolving section so that the water does not pass through said dissolving section;
 a gas-dissolved water discharge channel for guiding the gas-dissolved water from said dissolving section, said second supply channel communicating with said gas-dissolved water discharge channel so that the water that does not pass through said dissolving section flows into the gas-dissolved water to thereby dilute the gas-dissolved water;
 a flow rate regulator arranged in said water supply channel, for regulating a flow of the water guided through said water supply channel;
 a dissolved solution gas concentration meter for measuring a solution gas concentration of the gas-dissolved water in said gas-dissolved water discharge channel; and
 a controller for controlling said flow rate regulator based on the solution gas concentration measured by said dissolved solution gas concentration meter.

2. The gas-dissolved water producing apparatus of claim 1, wherein said dissolving section comprises a hollow fiber membrane, said first supply channel communicating with a first side of said hollow fiber membrane so as to guide the water into said first side of said hollow fiber membrane, said solution gas supply channel communicating with a second side of said hollow fiber membrane so as to introduce the solution gas into said second side of said hollow fiber membrane to mix the solution gas with the water to thereby generate the gas-dissolved water.

3. The gas-dissolved water producing apparatus of claim 2, wherein said controller is operable to control said flow rate regulator so that a pressure of the water guided into said hollow fiber membrane is maintained greater than a pressure of the solution gas guided into said hollow fiber membrane.

4. The gas-dissolved water producing apparatus of claim 1, wherein said controller is operable to control said flow rate regulator so as to maintain a pressure of the water greater than a pressure of solution gas flowing through the solution gas supply channel to said dissolving section.

5. The gas-dissolving water producing apparatus of claim 4, wherein said controller is further operable to control said flow rate regulator so that the gas-dissolved water has a solution gas concentration no greater than a saturated solution gas concentration.

6. A gas-dissolved water producing apparatus comprising:
 a dissolving section for dissolving a solution gas into water to form gas-dissolved water;
 a solution gas supply channel for guiding the solution gas into said dissolving section;
 a water supply channel for guiding the water, said water supply channel including:
  a first supply channel for guiding the water into said dissolving section; and
  a second supply channel for guiding the water around said dissolving section so that the water does not pass through said dissolving section, said second supply channel being branched off from said first supply channel so as to form a bypass around said dissolving section;

a gas-dissolved water discharge channel for guiding the gas-dissolved water from said dissolving section, said second supply channel communicating with said gas-dissolved water discharge channel so that the water bypassed around said dissolving section flows into the gas-dissolved water to thereby dilute the gas-dissolved water;

a flow rate regulator arranged in said gas-dissolved water discharge channel downstream of said dissolving section, for regulating a flow of the water guided through said water supply channel; and a dissolved solution gas concentration meter for measuring a solution gas concentration of the gas-dissolved water in said gas-dissolved water discharge channel.

7. The gas-dissolved water producing apparatus of claim 6, wherein said dissolving section comprises a hollow fiber membrane, said first supply channel communicating with a first side of said hollow fiber membrane so as to guide the water into said first side of said hollow fiber membrane, said solution gas supply channel communicating with a second side of said hollow fiber membrane so as to introduce the solution gas into said second side of said hollow fiber membrane to mix the solution gas with the water to thereby generate the gas-dissolved water.

8. The gas-dissolved water producing apparatus of claim 6, wherein said dissolving section comprises a processing tank, wherein said flow rate regulator is operable to maintain a pressure of the water guided into said processing tank greater than a pressure of the solution gas guided into said processing tank.

9. The gas-dissolved water producing apparatus of claim 6, wherein said flow rate regulator comprises a first flow rate regulator, and wherein said dissolved solution gas concentration meter is located in said gas-dissolved water discharge channel downstream of a point whereat said second supply channel communicates with said gas-dissolved water discharge channel, said apparatus further comprising:

a second flow rate regulator arranged in said second supply channel, for regulating a flow of the water guided through said second supply channel so as to be bypassed around said dissolving section; and a controller for controlling at least one of said first flow rate regulator and said second flow rate regulator based on the solution gas concentration measured by said dissolved solution gas concentration meter so as to maintain the solution gas concentration of the gas-dissolved water at a prescribed level.

10. An ultrasonic cleaning system comprising:

said gas-dissolved water producing apparatus of claim 6; and an ultrasonic wave-transmitting device for imparting ultrasonic energy to the gas-dissolved water produced by said gas-dissolved water producing apparatus while a workpiece is being cleaned with the gas-dissolved water.

11. A gas-dissolved water producing apparatus comprising:

a dissolving section for dissolving a solution gas into water to form gas-dissolved water;

a solution gas supply channel for guiding the solution gas into said dissolving section;

a water supply channel for guiding the water, said water supply channel including:

a first supply channel for guiding the water into said dissolving section; and a second supply channel for guiding the water around said dissolving section so that the water does not pass through said dissolving section, said second supply channel being branched off from said first supply channel so as to form a bypass around said dissolving section;

a gas-dissolved water discharge channel for guiding the gas-dissolved water from said dissolving section, said second supply channel communicating with said gas-dissolved water discharge channel so that the water bypassed around said dissolving section flows into the gas-dissolved water to thereby dilute the gas-dissolved water;

a dissolved solution gas concentration meter in said gas-dissolved water discharge channel downstream of a point whereat said second supply channel communicates with said gas-dissolved water discharge channel, for measuring a solution gas concentration of the gas-dissolved water in said gas-dissolved water discharge channel; and either one of a first flow rate regulator and a second flow rate regulator, wherein:

said first flow rate regulator is arranged in said gas-dissolved water discharge channel downstream of said dissolving section whereat said second supply channel communicates with said gas-dissolved water discharge channel, for regulating a flow rate of the water flowing through said dissolving section; and said second flow rate regulator is arranged in said second supply channel, for regulating a flow of the water guided through said second supply channel so as to be bypassed around said dissolving section.

12. An ultrasonic cleaning system comprising:

said gas-dissolved water producing apparatus of claim 11; and an ultrasonic wave-transmitting device for imparting ultrasonic energy to the gas-dissolved water produced by said gas-dissolved water producing apparatus while a workpiece is being cleaned with the gas-dissolved water.

13. An ultrasonic cleaning system for mega-sonic cleaning, comprising:

a gas-dissolved water producing apparatus for producing gas-dissolved water having a solution gas concentration no greater than a saturated solution gas concentration, said gas-dissolved water producing apparatus including:

a dissolving section for dissolving the solution gas into water to form gas-dissolved water;

a solution gas supply channel for guiding the solution gas into said dissolving section;

a water supply channel for guiding the water, said water supply channel including:

a first supply channel for guiding the water into said dissolving section; and a second supply channel for guiding the water around said dissolving section so that the water does not pass through said dissolving section, said second supply channel being branched off from said first supply channel so as to form a bypass around said dissolving section;

a gas-dissolved water discharge channel for guiding the gas-dissolved water from said dissolving section, said second supply channel communicating with said gas-dissolved water discharge channel so that the water bypassed around said dissolving section flows into the gas-dissolved water to thereby dilute the gas-dissolved water;

a flow rate regulator arranged in said water supply channel, for regulating a flow of the water guided through said water supply channel; and a dissolved solution gas concentration meter for measuring the solution gas concentration of the gas-dissolved water in said gas-dissolved water discharge channel; and an ultrasonic wave-transmitting device for imparting ultrasonic energy to the gas-dissolved water produced by said gas-dissolved water producing apparatus while a workpiece is being cleaned with the gas-dissolved water.

14. An ultrasonic cleaning method comprising:

producing gas-dissolved water using a gas-dissolved water producing apparatus including:
- a dissolving section for dissolving a solution gas into water to form gas-dissolved water;
- a solution gas supply channel for guiding the solution gas into said dissolving section;
- a water supply channel for guiding the water, said water supply channel including:
  - a first supply channel for guiding the water into said dissolving section; and
  - a second supply channel for guiding the water around said dissolving section so that the water does not pass through said dissolving section;
- a gas-dissolved water discharge channel for guiding the gas-dissolved water from said dissolving section, said second supply channel communicating with said gas-dissolved water discharge channel so that the water that does not pass through said dissolving section flows into the gas-dissolved water to thereby dilute the gas-dissolved water;
- a flow rate regulator arranged in said water supply channel, for regulating a flow of the water guided through said water supply channel;
- a dissolved solution gas concentration meter for measuring a solution gas concentration of the gas-dissolved water in said gas-dissolved water discharge channel; and
- a controller for controlling said flow rate regulator based on the solution gas concentration measured by said dissolved solution gas concentration meter;
- wherein said dissolving section comprises a hollow fiber membrane, said first supply channel communicating with a first side of said hollow fiber membrane so as to guide the water into said first side of said hollow fiber membrane, said solution gas supply channel communicating with a second side of said hollow fiber membrane so as to introduce the solution gas into said second side of said hollow fiber membrane to mix the solution gas with the water to thereby generate the gas-dissolved water; and imparting ultrasonic energy to the gas-dissolved water produced by said method of producing gas-dissolved water; and cleaning a workpiece using the gas-dissolved water to which the ultrasonic energy has been imparted.

* * * * *